US008973773B2

(12) United States Patent
Elliott (10) Patent No.: US 8,973,773 B2
(45) Date of Patent: Mar. 10, 2015

(54) SEALS

(75) Inventor: Howard Elliott, Oxfordshire (GB)

(73) Assignee: Future Technology (UK) Ltd, Oxfordshire (GB)

( * ) Notice: Subject to any disclaimer, the term of this patent is extended or adjusted under 35 U.S.C. 154(b) by 0 days.

(21) Appl. No.: 13/878,154

(22) PCT Filed: Sep. 26, 2011

(86) PCT No.: PCT/GB2011/001389
§ 371 (c)(1),
(2), (4) Date: May 2, 2013

(87) PCT Pub. No.: WO2012/049446
PCT Pub. Date: Apr. 19, 2012

(65) Prior Publication Data
US 2013/0320020 A1    Dec. 5, 2013

(30) Foreign Application Priority Data

Oct. 14, 2010    (GB) .................................. 1017333.4

(51) Int. Cl.
*B65D 53/00* (2006.01)
*A61J 1/03* (2006.01)
(Continued)

(52) U.S. Cl.
CPC ................. *B65D 53/00* (2013.01); *A61J 1/035* (2013.01); *B65D 75/327* (2013.01);
(Continued)

(58) Field of Classification Search
USPC .......................... 340/309; 206/534.2, 531, 532
See application file for complete search history.

(56) References Cited

U.S. PATENT DOCUMENTS

| 7,552,824 B2 * | 6/2009 | Le et al. ..................... 206/534 |
| 2005/0087472 A1 | 4/2005 | Elliott |

(Continued)

FOREIGN PATENT DOCUMENTS

| EP | 2080502 A1 | 7/2009 |
| EP | 2243460 A1 | 10/2010 |
| WO | 2004028438 A2 | 4/2004 |
| WO | 2005058723 A1 | 6/2005 |
| WO | 2007138520 A1 | 12/2007 |

OTHER PUBLICATIONS

International Search Report for PCT/GB2011/001389 dated Dec. 16, 2011.

*Primary Examiner* — Anthony Stashick
*Assistant Examiner* — Jennifer N Zettl
(74) *Attorney, Agent, or Firm* — Kilyk & Bowersox, P.L.L.C.

(57) ABSTRACT

The invention provides a seal that forms part of a container for storing and dispensing consumer products. The container can be used in place of conventional blister packs for the packaging of pills, tablets or capsules or multi-cavity containers for organising and storing mixed medication for subsequent dispensation according to a predefined dosage regimen. The container includes a tray having a generally planar top surface into which has been formed one or more discrete cavities for receiving the consumer products. The seal includes a cover film (1) having a pattern of electrically conductive tracks (14) that defines a circuit per cavity. Pre-formed lines of separation (4) define a removable portion (2) per cavity to retain the consumer products in that cavity until it is removed along its line of separation. Each removable portion (2) is attached to the remainder of the cover film (1) by a frangible bridge region defined by a gap in the associated pre-formed line of separation (4) and which provides a pathway for the associated circuit (22). The frangible bridge region is torn to break the associated circuit (22) when the removable portion (2) is released or removed so that the contents of the underlying cavity can be dispensed.

24 Claims, 6 Drawing Sheets

(51) Int. Cl.
*B65D 75/32* (2006.01)
*A61J 7/04* (2006.01)

(52) U.S. Cl.
CPC .... *B65D 2203/00* (2013.01); *B65D 2575/3227* (2013.01); *H05K 2203/175* (2013.01); *A61J 2007/0418* (2013.01); *A61J 2007/0436* (2013.01)
USPC .......................................................... 220/378

(56) References Cited

U.S. PATENT DOCUMENTS

| | | |
|---|---|---|
| 2006/0249421 A1* | 11/2006 | Pham ............................ 206/531 |
| 2007/0084746 A1* | 4/2007 | Udo et al. ...................... 206/531 |
| 2008/0029424 A1 | 2/2008 | Elliott |
| 2010/0065464 A1 | 3/2010 | Elliott |

* cited by examiner

SEALS

FIELD OF THE INVENTION

The invention relates to seals that are suitable for use with containers for storing and dispensing consumer products. The term consumer products is intended to cover a wide variety of products as illustrated by the following (non-exhaustive) list: foods, either for immediate consumption, pre-cooked, pre-pared or oven ready, including prepared meals, confectionary, hardware and DIY items, cosmetics, seeds, animal and fish feeds, electronic components, medical appliances and dressings, medicines and medication such as pills, tablets and capsules.

The containers may be used in place of conventional blister packs for the packaging of pills, tablets and capsules, or may be used for organising and storing mixed medication for subsequent dispensation according to a predefined dosage regimen. The principle behind such mixed medication containers is that a dosage regimen of mixed medication can be organised in advance for a period of a week or more, and a patient or nurse can then remove from the container, at pre-defined times over the said period, the one or more pills, tablets and/or capsules to be administered on each occasion according to the dosage regimen.

BACKGROUND ART

Blister packs are of course well known for the storage and dispensing of pills, tablets and capsules, which are stored individually in cavities in a multi-cavity tray and removed by pushing each pill, tablet or capsule through a rupturable film or foil covering the cavities. The film or foil cover may be paper or a plastics film that can be peeled or torn away to expose the medication in the tray cavities, but is generally aluminium foil, which has the dual advantage of being easily rupturable and vapour-impermeable. Such blister packs normally carry only one unit dose of the same medication in each cavity.

Mixed medication blister packs have been proposed, having larger cavities for filling by a pharmacist, wherein each cavity in a multi-cavity tray can be filled with a mixture of medications. Typically, a tray may have a 2×7, 3×7, 4×7 or 5×7 array of cavities corresponding to 2, 3, 4 or 5 predefined medication times per day over a 7-day period, or one dose prescribed per day over a 2, 3, 4 or 5 week period. For example, a 4×7 tray may be filled with the medication to be taken at breakfast-time, lunchtime, early evening and immediately before retiring each day for a week, and then the filled cavities sealed with a rupturable or sequentially rupturable film or foil cover. Printed instructions on the pack identify the intended sequence of opening the individual cavities to dispense their contents according to the prescribed dosage regimen.

Disadvantages of conventional blister packs using a rupturable cover film are the difficulty experienced by some patients, particularly the elderly, in pushing the medication through the cover film, the need for expensive laminating equipment to seal the aluminium cover film over the cavities after the initial filling, and the difficulty experienced by the user in selecting the cavity containing the medication to be dispensed if the medication is pushed up through the foil from below. If the wrong cavity is opened by mistake then re-sealing is impossible because the cover film has ruptured.

A major disadvantage of the blister pack using a peelable cover film is the difficulty experienced by the user in peeling or tearing away a single selected portion of the cover film to expose the contents of only one preselected cavity. This can be achieved by scraping a finger-nail over a corner or tab portion of a segment of the cover film sealing the preselected cavity, but grasping that corner to peel away the complete segment sometimes requires considerable manual dexterity and possibly good eyesight, which is beyond the abilities of many elderly users. Also, if a tacky peelable adhesive is used to adhere the cover film to the tray, it is desirable to prevent the contents of the tray from coming into contact with the adhesive. Finally, the film cover film may not have as high a vapour impermeability as metal foil, so there is a reluctance on the part of pharmacists to pre-fill a mixed medication blister pack with medication for administration more than seven days in advance of the filling date, lest the medication deteriorates due to storage in humid ambient conditions.

WO 2005/023670 to the present Applicant describes a container that aims to overcome some or all of the above problems and disadvantages. The container is for storing and dispensing medication and includes a tray having a generally planar top surface into which has been formed one or more discrete cavities for receiving the medication. A cover film is adhered to the generally planar top surface of the tray by a layer of peelable adhesive to seal the one or more cavities to retain the medication in the one or more cavities. The cover film has pre-formed tear lines defining a tear-off portion per cavity to retain the medication in that cavity until it is removed by tearing along its tear lines. In practice it will be readily appreciated that the or each tear-off portion can also be defined by cut lines extending completely through the material of the cover film. The or each tear-off portion of the cover film has low vapour transmission properties in the area which in use overlies the associated cavity, those low vapour transmission properties being created by a barrier patch with high vapour barrier properties shaped and sized to overlie the associated cavity. The or each barrier patch is adhered to the underside of the cover film by the same layer of peelable adhesive as that which adheres the cover film to the top surface of the tray.

The barrier patch beneath the or each tear-off portion can be created from a single sheet of barrier film as follows. A single sheet of barrier film is secured to the underside of the cover film by a peelable adhesive. The barrier film has pre-formed tear-lines defining the periphery of the or each vapour-resistant barrier patch so that peeling away the majority of the barrier film from the cover film immediately prior to application of the cover film to secure it to the generally planar top surface of the tray exposes the peelable adhesive in areas necessary for adhesion to the tray but leaves a barrier patch attached to the underside of the or each tear-off portion of the cover film. In practice it will be readily appreciated that the or each barrier patch can also be defined by cut lines extending completely through the material of the barrier film.

The sheet of barrier film can have a further pre-defined tear line (or cut line) close to one edge thereof to define a tear-off strip which when removed exposes a location anchorage area of the peelable adhesive on the underside of the cover film, for adhering an edge portion of the cover film to an edge portion of the tray before peeling away the majority of the barrier film and adhering it over the cavities. To assist in the process of adhering the cover film to the top surface of the tray, the tray can have upstanding cover film location means. The cover film can have cooperating means for accurate location of the cover film over the tray with the one or more cavities and associated tear-off portions in register before adhering the cover film to the tray.

EP 1357050 to the present Applicant discloses an alternative container where the tear-off portions of the cover film have an associated lug portion that is not secured to the tray in use, for gripping by a user preparatory to tearing off the tear-off portion. The generally planar top surface of the tray also has an upwardly extending protrusion positioned to be located beneath each lug portion in use to bend that lug portion upwardly out of the plane of the remainder of the cover film when the cover film is secured to the tray. Because the or each lug portion is bent up out of the plane of the remainder of the cover film when the film is applied, it can very easily be grasped by the user for removal of the tear-off portion. This makes the container particularly suitable for elderly users or those with limited manual dexterity.

Although the containers described in WO 2005/023670 and EP 1357050 are considered to be easier to use than blister packs having rupturable or peelable cover films, there is still a potential problem that the medication can be incorrectly dispensed from the containers. It is known to apply electrically conductive tracks on to a rupturable cover film to provide a notification when the contents of a particular cavity are dispensed. However, such a system has not been applied to containers where the cover film has tear-off or removable portions.

SUMMARY OF THE INVENTION

The present invention aims to provide a "smart" seal for a dispensing container that can be monitored to record when the contents of a particular cavity have been dispensed. In particular, the present invention provides a seal for use with a container for storing and dispensing consumer products comprising a tray having a generally planar top surface into which has been formed one or more discrete cavities for receiving the consumer products, the seal comprising a cover film to seal the one or more cavities to retain the consumer products in the one or more cavities, the cover film having a pattern of electrically conductive tracks that defines a circuit per cavity and pre-formed lines of separation defining a removable portion per cavity to retain the consumer products in that cavity until it is removed along its line of separation, each removable portion being attached to the remainder of the cover film by a frangible bridge region defined by a gap in the associated pre-formed line of separation and which provides a pathway for the associated circuit.

The pattern of electrically conductive tracks may be applied or integrated into the cover film using any suitable technique. However, one preferred option is to print the electrically conductive tracks onto a surface of the cover film using a conductive ink. The electrically conductive tracks can be applied or integrated into the cover film either before or after the lines of separation are formed in the cover film to define the removable portion per cavity. The electrically conductive tracks can be applied to either surface of the cover film (i.e. the lower surface that faces towards the generally top surface of the tray in use or the upper surface) or may be integrated within the actual body of the cover film itself. The electrically conductive tracks will preferably be sufficiently flexible so that they are not broken by the flexing or bending of the cover film during handling or when it is adhered to the tray. It will be readily appreciated that the layout of the individual circuits will depend on the layout of the or each removable portion of the cover film. In a preferred arrangement each circuit will start and end at an edge region of the cover film where it can be electrically connected to, or integrated with, a suitable electronic module for monitoring the container and defines a continuous electrical circuit that extends in part along the pathway provided by the frangible bridge region of the associated removable portion. The electronic module may include one or more contact regions which are in electrical contact with the start and end of each circuit in use so that the electronic module can record when each circuit is broken.

The frangible bridge region is designed to tear when the associated removable portion is released or removed from the remainder of the cover film along its line of separation. Tearing the frangible bridge region breaks the associated circuit that runs along the frangible bridge region (i.e. along the pathway defined by the frangible bridge region) and this is recorded by the electronic module. By monitoring the circuits the electronic module can determine which of the removable portions of the cover film has been released or removed from the remainder of the cover film and when that occurred. Recorded information about the removal of the removable portions can be stored within the electronic module or transmitted or downloaded to a remote device such as a computer or modem. For example, the electronic module can transmit the information either periodically or when a circuit is broken using any suitable sort of wireless communication, or the electronic module can be removed from the container and physically connected to a remote device. If the container is used to store high value consumer items then the electronic module may be used to check for tampering or the unauthorised removal or release of a removable portion of the cover film. If the container is used for dispensing medication then the electronic module may be used to check if the medication is being properly dispensed according to a prescribed dosage regimen, the details of which may be stored in the electronic module. In this way, the electronic module may provide "real time" monitoring of the dispensing of the contents of the container. If medication is not being dispensed according to the prescribed dosage regimen then the patient or the responsible medical professional can be automatically alerted, e.g. by SMS message sent by the electronic module or the remote device. The electronic module is preferably programmable and can include other information such as the contents of each cavity or, in the case where the container is used for dispensing medication, patient information such as contact details, relevant medical information, details regarding the medication in each cavity and a prescribed dosage regimen, for example.

The periphery of the or each removable portion can be defined by a pre-formed cut line extending completely through the material of the cover film, a pre-scored or pre-perforated tear line, or any combination thereof. The pre-scored tear lines may be created by pressing a knife on to the surface of the cover film so as to cut or score part way through but not fully through the thickness of the cover film.

The depth of the pre-scored tear lines or the size and shape of the individual perforations of the pre-perforated tear lines can be determined to provide the right amount of resistance to separation for any given application. Increasing the resistance to separation can reduce the likelihood of the removable portions being removed accidentally or being pushed into the discrete cavities of the underlying tray if, for example, dispensing containers are stacked one on top of the other. The pre-scored tear lines, pre-perforated tear lines and cut lines can be formed using a rotary die cutter or the like.

The line of separation defining the or each removable portion does not extend completely around the periphery of the associated cavity to define the gap. In some previous seal arrangements provided by the present Applicant a similar gap has been provided so that the removable portion remains attached to the cover film after it has been released and the contents of the cavity have been dispensed. It will be readily appreciated that in the present arrangement the gap that defines the frangible bridge region is designed to tear so that the associated circuit is broken. A further gap in each line of separation may be provided so that the removable portion remains attached to the remainder of the cover film. In other words, the line of separation defining the or each removable portion may include a first gap that defines a frangible bridge region that is designed to tear when the removable portion is released or removed from the remainder of the cover film and a second gap that is not designed to tear so that the removable portion remains attached to the remainder of the cover film by a non-frangible bridge region (e.g. a bridge region that is non-frangible unless excessive force is applied). The first gap only needs to be wide enough to define a pathway for the electrically conductive track that forms the associated circuit whereas the second gap can have a width that is sufficient to prevent tearing unless excessive force is applied to the removable portion. An arrangement where the removable portions remain attached to the remainder the cover film is considered to be more environmentally friendly because the individual removable portions do not have been discarded each time the contents of a cavity are dispensed.

In some cases, the line of separation defining the or each removable portion may includes two or more gaps that each define a frangible bridge region and which are designed to tear when the removable portion is released or removed from the remainder of the cover film when the contents of the associated cavity are to be dispensed. The number and position of the frangible bridge regions will depend on the pattern of electrically conductive tracks and can be provided as necessary to determine that the associated removable portion has been fully or partially released or removed. In an arrangement where each line of separation has two or more gaps that define a frangible bridge region then a first gap may provide a first pathway to allow the electrically conductive track to pass from the surrounding region of the cover film onto the removable portion and a second gap may provide a second pathway to allow the electrically conductive track to pass from the removable portion to the surrounding region of the cover film. It will normally be impossible to remove the consumer products from a cavity without tearing the frangible bridge region. If more than one frangible bridge region is provided then the circuit can be broken when one or more of the regions is torn or when all of the regions are torn depending on the layout of the electrically conductive tracks and the configuration of the electronic module. When some but not all of the frangible bridge regions are torn then the electronic module may record that the associated removable portion has been only partially released or removed from the remainder of the cover film, for example.

The cover film that is used to seal the one or more cavities may be adhered to the generally planar top surface of the tray by a suitable adhesive (e.g. a cold-seal process) or the seal can be heat-sealed directly to the tray.

The cover film can be a metal foil, a metallized polymeric film or paper sheet, a plastics film of single or multiple layer construction, or any combination thereof, and is preferably non-rupturable (except around pre-formed tear lines) so that the medication cannot be accidentally or deliberately pushed through it.

The or each removable portion of the cover film may include a barrier patch shaped and sized to overlie the associated cavity. The or each associated barrier patch can be formed in a barrier film that is adhered to the cover film (e.g. by a layer of peelable adhesive or static bonding). In other words, a barrier film may be secured to the cover film, the barrier film having pre-formed lines of separation defining the periphery of a barrier patch per removable portion that is shaped and sized so that in use it overlies an associated cavity.

The barrier film can be a metal foil, a metallized polymeric film or paper sheet, a plastics film of single or multiple layer construction, or any combination thereof.

In the case where the periphery of the or each removable portion is defined by a pre-formed cut line then an associated barrier patch formed in a barrier film will be shaped and sized to be larger than the removable portion. The cover film and barrier film can be adhered together by a layer of peelable adhesive or static bonding such that the or each barrier patch must be peeled away from a narrow border of the cover film immediately outside the line of separation defining the periphery of the removable portion when the overlying removable portion is released.

The periphery of the or each barrier patch can be defined by a pre-formed cut line extending completely through the material of the barrier film, a pre-scored or pre-perforated tear line, or any combination thereof. The pre-scored tear lines, pre-perforated tear lines and cut lines can be formed using a rotary die cutter or the like.

In a preferred arrangement of the invention, the pre-formed line of separation defining the periphery of the or each barrier patch lies outside the pre-formed line of separation defining the periphery of the overlying removable portion such that the barrier patch is larger than the associated removable portion. In this case the barrier patch can overly a narrow border or region of the generally planar top surface of the tray extending completely around the periphery of the associated cavity in use. The barrier patch must also be peeled away from a narrow border of the cover film immediately outside the line of separation defining the periphery of the removable portion when the overlying removable portion is released. If the pre-formed line of separation defining the periphery of the or each removable portion is a cut line extending completely through the material of the cover film substantially around the whole of the periphery of the removable portion then there is no physical connection between the individual removable portion and the remainder of the cover film apart from the frangible bridge region. The individual removable portion will therefore normally be held in position within the plane of the remainder of the cover film by the associated larger barrier patch to which it is adhered. It is important to note that the or each barrier patch is not secured to the top surface of the tray, but only to the cover film. For the avoidance of any doubt, it should be noted that in other arrangements where the periphery of the removable portion is not defined by cut lines the or each barrier patch may be larger than, the same size as, or smaller than the associated removable portion and may be shaped and sized to be larger than, the same size as, or smaller than the associated cavity of the tray.

The preferred arrangement may incorporate tamper evident properties because once a removable portion of the cover film has been released it cannot be easily reattached over the associated cavity. This is because the barrier patch is larger than the overlying removable portion such that in use it overlies a region of the generally planar top surface of the tray extending completely around the periphery of the associated cavity. Once the removable portion and the attached barrier patch have been released, there will be a narrow border of the cover film immediately outside the line of separation defining the periphery of the removable portion. It will be readily appreciated that this narrow border is secured to the periphery of the barrier patch prior to the release of the removable portion. In practice, if the underside of the cover film is covered with peelable adhesive, the narrow border will tend to adhere to the generally planar top surface of the tray. This makes it very difficult to slide the peripheral edge of the barrier patch back between the cover film and the top surface of the tray to reattach the released removable portion over the associated cavity. Tamper evident properties are especially important if the container is used to store and dispense food and medication such as pills, tablets and capsules. Further tamper evident properties are, of course, provided by the tearing of the frangible bridge region.

The barrier film can have a further pre-defined cut line or tear line close to one edge thereof to define a removable strip which when removed exposes a location anchorage area of the peelable adhesive on the underside of the cover film, for adhering an edge portion of the cover film to an edge portion of the tray before peeling away the majority of the barrier film and adhering the cover film over the cavities. To assist in the process of adhering the cover film to the top surface of the tray, the tray can have upstanding cover film location means. The cover film can have cooperating means for accurate location of the cover film over the tray with the one or more cavities and associated removable portions in register before adhering the cover film to the tray. Where the barrier film is to be secured to the top surface of the tray, the tray can have upstanding seal location means. The cover film can have cooperating means for accurate location of the cover film over the tray with the one or more cavities and associated removable portions in register before adhering the barrier film to the tray.

The seal for the container preferably has high vapour barrier properties, optionally by selecting an appropriate material or thickness for the cover film and/or the barrier film. Providing low vapour permeability in the region that overlies the or more cavities means that any medication temporarily encapsulated in the cavities can be protected from variations in ambient humidity during storage of the medication within the container. Low vapour permeability is also important if the container is used to store and dispense consumer products such as foods or electronic components that can perish or suffer damage if too much moisture is allowed to enter the discrete cavities through the seal. It will, however, be recognised that the seal may be provided with other selected barrier properties such as high light barrier properties or high gas barrier properties to reduce or prevent the transmission of light or atmospheric gases such as oxygen, for example. The seal may also be provided with high electrostatic barrier properties.

The container can be a multiple-compartment container for containing and dispensing medication according to a pre-defined dosage regimen, wherein an array of discrete cavities are formed into the generally planar top surface of the tray and the cover film has pre-formed lines of separation defining an array of removable portions. The seal can be printed with details of the sequence of the dosage regimen, so that the user can determine the correct sequence of opening and can release the individual removable portions.

Each removable portion can include a lug portion as described in EP 1357050 adapted to be grasped preparatory to removing the associated removable portion. In this arrangement each removable portion can be attached to the remainder of the cover film by a frangible bridge region defined by a gap in a part of the associated pre-formed line of separation which defines the lug portion.

The present invention further provides a container for storing and dispensing consumer products comprising a tray having a generally planar top surface into which has been formed one or more discrete cavities for receiving the consumer products, and a seal comprising a cover film adhered to the generally planar top surface of the tray to seal the one or more cavities to retain the consumer products in the one or more cavities, the cover film having a pattern of electrically conductive tracks that defines a circuit per cavity and pre-formed lines of separation defining a removable portion per cavity to retain the consumer products in that cavity until it is removed along its line of separation, each removable portion being attached to the remainder of the cover film by a frangible bridge region defined by a gap in the associated pre-formed line of separation and which provides a pathway for the associated circuit.

The container can further include an electronic module for monitoring the or each circuit and recording when the or each removable portion is released or removed from the remainder of the cover film, i.e. when the associated frangible bridge is torn. The electronic module can be permanently or releasably secured to the tray in electrical contact with the or each circuit. For example, each circuit may have termination points which are in electrical contact with suitable parts (e.g. contacts or pins) of the electronic module in use.

The electronic module may be located anywhere on the container but in one arrangement it is slidably received between guide parts of the tray and the edge region of the cover film may be supported by a protruding tab of the tray which is received within a slot provided in the electronic module when it is properly received. In this case the termination points are preferably formed on the edge region of the cover film.

Further features of the seal for the dispensing container are as described above.

To dispense the contents of a cavity, the consumer simply pushes down on the associated removable portion with their forefinger. If the removable portions have lug portions as described in EP 1357050 then the removable portion that overlies the particular cavity can be removed by grasping its lug portion. The frangible bridge region that defines the pathway for the associated circuit can be formed in any part of the lines of separation, including those that define the lug portions. The consumer may have to release the removable portion from the remainder of the cover film by tearing along tear lines. As the removable portion is released or removed to gain access to the underlying cavity the frangible bridge region will be torn so that the associated circuit is broken. In an arrangement where a barrier film is provided and the underlying barrier patch is larger than the associated removable portion then it must also be peeled away from the overlapping region of the cover film. The force needed to release the removable portion is preferably less than is necessary to push the consumer products through a rupturable cover film. Tearing the frangible bridge region breaks the circuit for the particular removable portion and this is recorded by the electronic module that is associated with the container. The electronic module provides a record of precisely when each of the removable portions are released or removed from the remainder of the cover film and hence when the contents of the associated cavities are expected to have been dispensed.

The released removable portion is then pushed down into the cavity on top of the consumer products and can be removed through the newly created opening in the cover film by sliding it up the side of the cavity until it can be grasped firmly between forefinger and thumb. Alternatively, if the tray is formed from a suitable (preferably plastics) material such that the one or more cavities are compressible, the contents of a cavity can be dispensed by pushing the consumer products through the cover film from behind.

If a further gap is provided in the line of separation that defines the periphery of the removable portion then the removable portion can remain attached to the remainder of the cover film by the non-frangible bridge region and the contents of the cavity can be dispensed as described above.

DETAILED DESCRIPTION OF THE INVENTION

Although the dispensing container according to the invention is suitable for storing and dispensing a wide range of consumer products, the rest of the specification will concentrate mainly on its use as a multiple-compartment container for organising and storing mixed medication for subsequent dispensation according to a predefined dosage regimen.

Referring to FIGS. 1 to 4 there is shown a seal that is designed to be adhered to a moulded tray to form a multiple-compartment container. The tray is formed from a sheet of thermoplastic material, and may be formed for example by press moulding or by vacuum moulding. The tray has a generally planar top surface into which has been formed a 4×7 array of discrete cavities. It will be readily appreciated that other arrangements of the discrete cavities are possible depending on the particular dosage regimen required.

Figure 1:
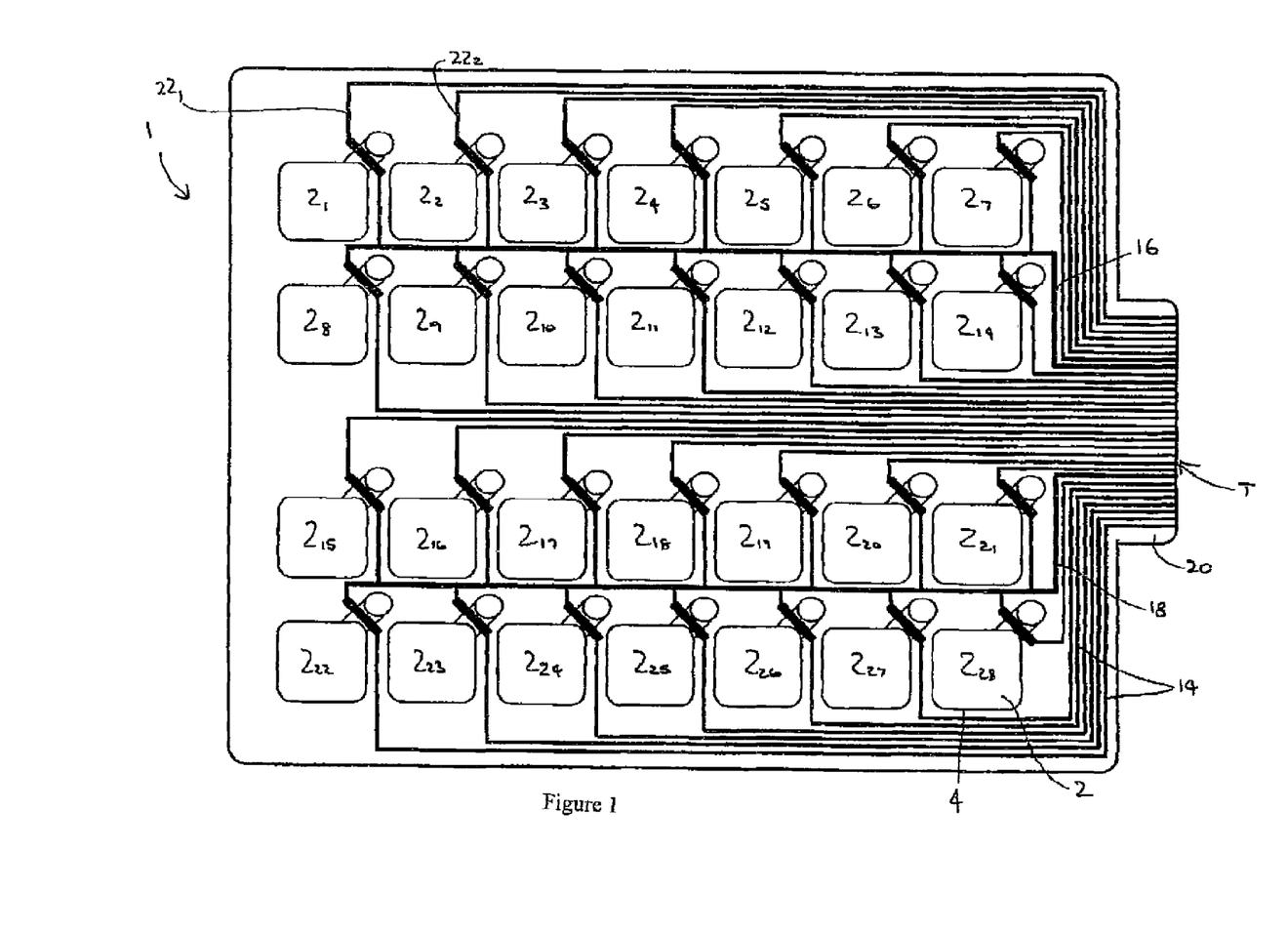
FIG. 1 is a plan view of a cover film according to a first embodiment of the present invention.
Figure 2:
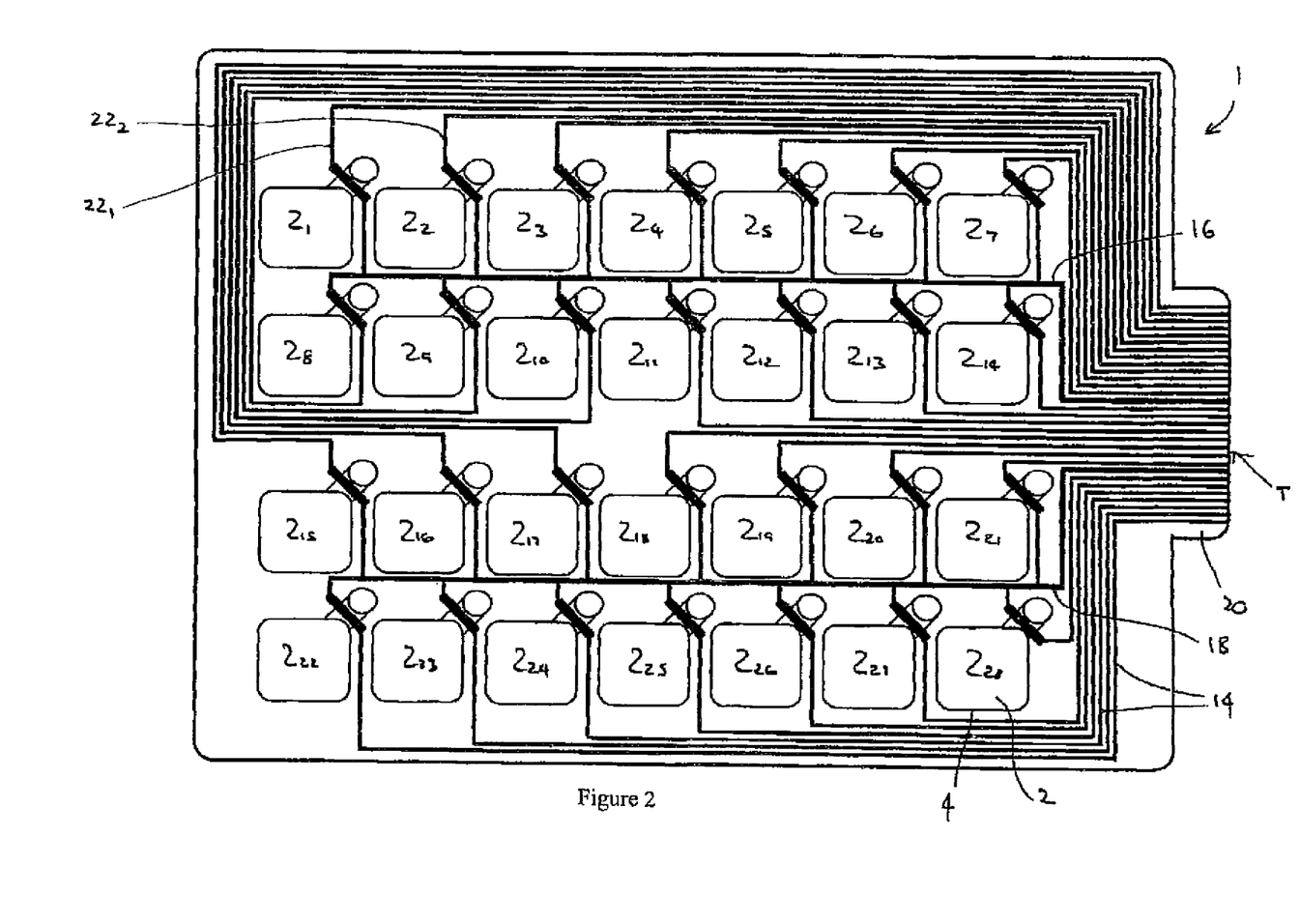
FIG. 2 is a plan view of a cover film according to a second embodiment of the present invention.

The seal is typically of a laminated construction but only the top layer or cover film 1 is shown in FIGS. 1 and 2. The cover film 1 is a sheet of smooth and flexible, and preferably transparent, plastics film, the outline of which corresponds generally to the outline of the tray with which it is to be used. A suitable material for the cover film 1 is polypropylene.

The cover film 1 includes a 4×7 array of removable portions 2 each of which is defined by cut lines 4. The cut lines 4 define a line of separation along which the removable portions 2 can be separated from the remainder of the cover film 1. The removable portions include a main portion 6 that extends generally around the periphery of an underlying cavity in the moulded tray when the seal is adhered to the top surface of the tray and a lug portion 8 that can be grasped preparatory to removing the removable portion. The lug portions 8 can be raised out of the remainder of the cover film by upwardly extending protrusions that are formed on the generally planar top surface of the tray.

Figure 3:
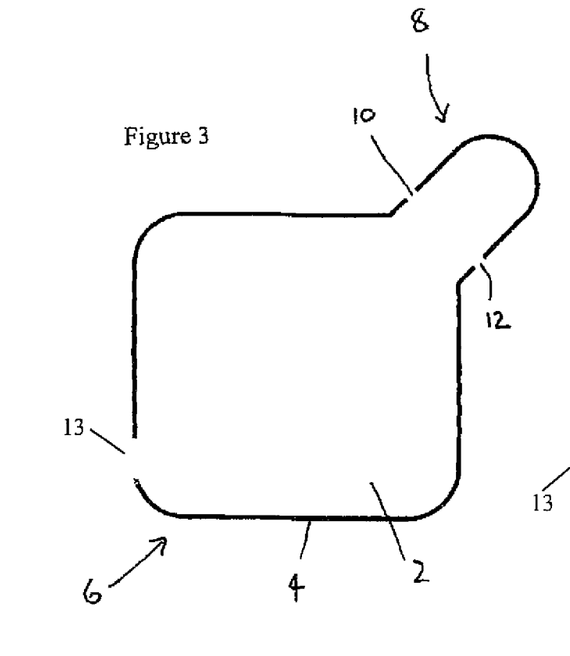
FIG. 3 is a detail view showing a removable portion of the cover film before the electrically conductive tracks are printed on the cover film.

As shown in FIG. 3, a cut line 4 extends completely around the periphery of the main portion 6 of each removable portion 2 but two separate frangible bridge regions 10, 12 are provided in the cut lines that define the associated lug portion 8. In practice, any number of frangible bridge regions can be provided anywhere in the cut line of each removable portion including the part that defines the periphery of the main portion 6.

The entire underside of the cover film 1 is coated with a layer of peelable adhesive and is adhered to a barrier film (not shown). The barrier film is a sheet of smooth and flexible, and preferably transparent, plastics film, the outline of which corresponds generally to the outline of the cover film with which it is to be used. A suitable material for the barrier film is polypropylene.

Cut lines in the barrier film (not shown) define the outer peripheries of a 4×7 array of vapour-impermeable barrier patches, which in use are adhered to the underside of the respective removable portions and lie directly over the respective cavities of the moulded tray. The barrier patches can be slightly larger than the removable portions such that in use they overly a region of the generally planar top surface of the tray extending completely around the periphery of the respective cavities. However, the barrier patches may be the same size as, or smaller than, the removable portions 2. The barrier patches may extend underneath the lug portions 8.

It will be readily appreciated that the cut lines in the cover film 1 can be replaced with perforations or by score lines. Similarly, the cut lines in the barrier film (not shown) can be replaced with perforations or by score lines. The cut lines or tear lines will normally be formed using a die cutter after the cover film 1 and the barrier film (not shown) have been secured together to form the laminated seal. A pair of rotary die cutters can be used with one die cutter forming cut lines or tear lines in the cover film 1 from one side of the seal and the other die cutter forming cut lines or tear lines in the barrier film (not shown) from the other side of the seal. In the case of cut lines or perforation lines, care must be taken to ensure that the overall physical integrity of the seal is maintained. For example, in practice it will often be the case that the cut lines or perforations formed in the cover film will extend slightly into the layer of peelable adhesive, but the respective rotary die cutter is preferably set such that the cut lines or perforation lines do not extend into the barrier film (not shown) to any appreciable extent.

A pattern of electrically conductive tracks 14 is applied to the cover film 1, e.g. by printing the pattern on the upper surface using electrically conductive ink. The pattern includes a circuit for each removable portion 2 of the cover film and may have any suitable layout. More particularly, the patterns shown in FIGS. 1 and 2 include a first common circuit line 16 which runs between the first and second rows of removable portions and a second common circuit line 18 which runs between the third and fourth rows of removable portions. Both of the first and second common circuit lines terminate at an edge or tab region 20 of the cover film 1.

Taking a first individual circuit $22_1$ for the removable portion $2_1$ then it starts (or ends) at the termination point of the first common circuit line 16 at the tab region 20. In the vicinity of the removable portion $2_1$ the first individual circuit $22_1$ branches off the first common circuit line 16 and passes across the lug portion 8 of the removable portion $2_1$ before running back to the tab region 20 of the cover film where it ends (or starts). The circuit for the removable portion $2_1$ therefore starts and ends at the termination points T at the tab region of the cover film. Taking a second individual circuit $22_2$ for the removable portion $2_2$ then it starts (or ends) at the termination point of the first common circuit line 16 at the tab region. In the vicinity of the removable portion $2_2$ the second individual circuit $22_2$ branches off the first common circuit line 16 and passes across the lug portion of the removable portion $2_2$ before running back to the tab region 20 of the cover film where it ends (or starts). Individual circuits for the other removable portions $2_3 \ldots 2_{28}$ are provided in a similar manner with circuits for the removable portions $2_{15} \ldots 2_{28}$ branching off the second common circuit line 18.

Figure 4:
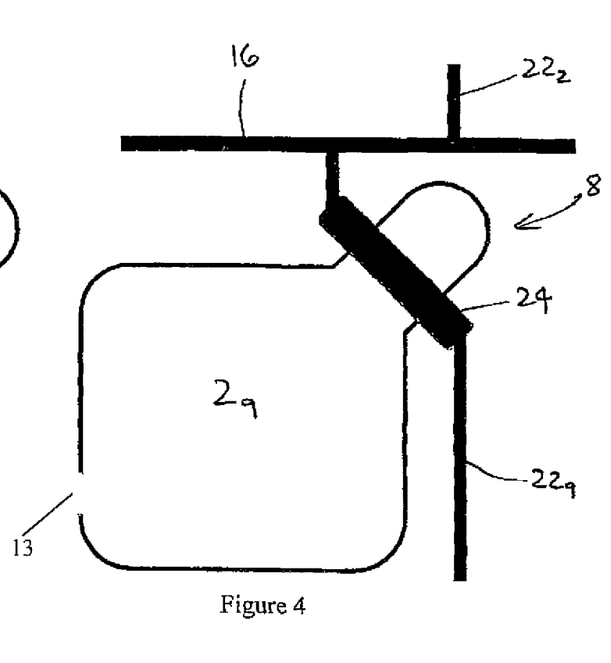
FIG. 4 is a detail view showing the removable portion of the cover film of FIG. 3 after the electrically conductive tracks are printed on the cover film to define the associated circuit.

The frangible bridge regions 10, 12 are shown in more detail in FIGS. 3 and 4 and are defined by gaps in the cut line 4 that extends around the lug portion 8 of each removable portion 2. The frangible bridge regions 10, 12 define a continuous pathway extending across each lug portion 8 that can be traversed by the electrically conductive track for the associated circuit. This means that if the electrically conductive tracks 14 are printed on the upper surface of the cover film as a preliminary step then they are not broken when the cut lines are subsequently formed in the cover film 1. Similarly, if the cut lines 4 are provided in the cover film before the electrically conductive tracks 14 are printed on the upper surface of the cover film then the frangible bridge regions 10, 12 provide a continuous pathway for the electrically conductive tracks so that they do not have to traverse a cut line (or a tear line). FIG. 4 shows how a part 24 of each electrically conductive track 14 extends across the lug portion 8. The part 24 of the conductive track is wider than the frangible bridge regions to allow for any misalignment of the track relative to the removable portions of the seal during manufacture and printing.

Figure 5:
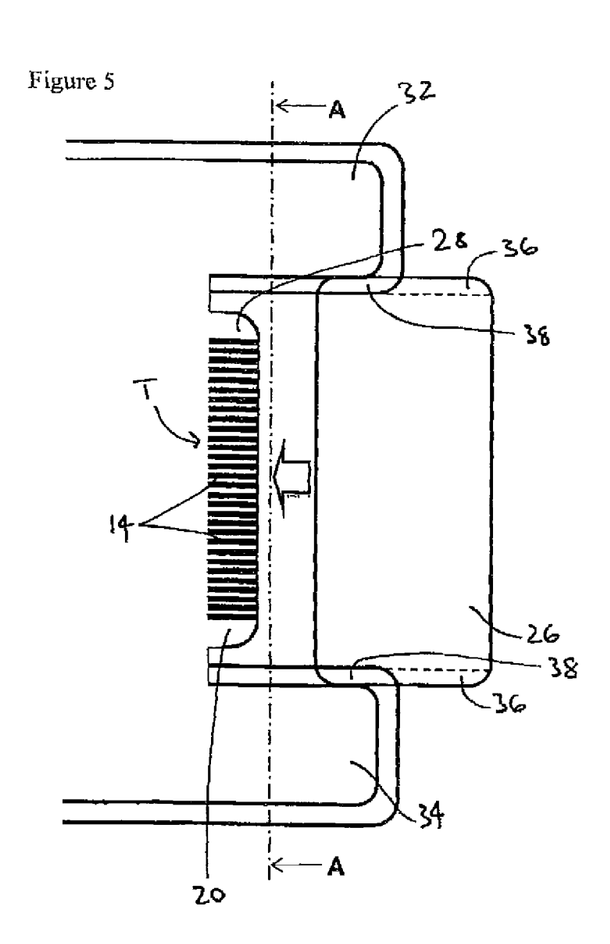
FIG. 5 is a plan view showing how an electronic module is releasably secured to a container.
Figure 6:
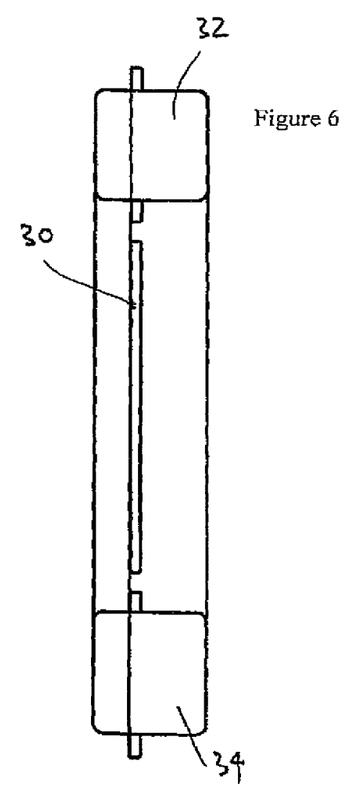
FIG. 6 is a cross section view along the line A-A of FIG. 5.

An electronic module 26 can be releasably secured to the moulded tray at the edge or tab region of the cover film and includes contacts that are in electrical contact with the termination points T of the various circuits when it is properly installed. The electronic module 26 may include a power source (e.g. a battery), a microprocessor or other electronic controller for monitoring the individual circuits, a memory for recording and storing information and a communication device to allow the stored information to be downloaded or transmitted to a remote device. With reference to FIGS. 5 and 6 the edge or tab region 20 of the cover film may overlie a protruding tab 28 of the moulded tray 30 which provides support. Guides 32, 34 are provided on either side of the protruding tab 28 and the electronic module 26 includes grooves 36 into which opposing edges 38 of the guides are located so that the electronic module can slide towards the protruding tab. The protruding tab 28 and the edge or tab region 20 of the cover film 1 can therefore be received in a slot that is formed in the facing surface of the electronic module 26. When the electronic module 26 is properly located in use its contacts are in electrical contact with each of the circuit termination points T that are printed on the upper surface of the cover film 1 so that the individual circuits can be monitored by the microprocessor or other electronic controller.

In use, a pharmacist or a carer, or the patient himself or herself will distribute medication in the form of pills, tablets and/or capsules between the 28 discrete cavities formed in the top surface of the tray in accordance with a seven-day or 28-day dosage regimen. For example, the seven rows of cavities represent the days of the week, and the four columns can represent either four consecutive weeks of a 28-day dosage cycle, or four different dosage times for each day of treatment. In the latter case, the first column can represent breakfast-time, the second column lunchtime, the third column early evening and the fourth column bedtime. Either a uniform medication can be distributed through the 28 discrete cavities, or a varying mixture of medications can be placed into each cavity.

When the cavities have been properly filled the seal is secured to the top surface of the tray.

The electronic module 26 may be programmed with patient details, relevant medical information and the prescribed dosage regimen. The programming may be done by wireless communication or downloaded to the electronic module 26 when it is physically connected to a remote device.

To dispense the medication stored in one of the discrete cavities, the user simply presses down on the overlying removable portion 2 or grasps the raised lug portion 8 and pulls the removable portion. The removable portion 2 separates from the remainder of the cover film along the cut line and tears along the frangible bridge regions 10, 12. In this case the removable portion is completely removed from the cover film but in an alternative arrangement a further gap can be provided in the cut line to define a non-frangible bridge region 13 (FIGS. 3 and 4) so that the removable portion remains attached to the remainder of the cover film once it has been released and the contents of the associated cavity have been dispensed. It will be readily appreciated that even in this alternative arrangement the frangible bridge regions 10, 12 will be torn but non-frangible bridge region 13 will not be torn.

Tearing the frangible bridge regions 10, 12 breaks the associated circuit. For example, if removable portion $2_1$ is removed by the user then the circuit $22_1$ will be broken as the frangible bridge regions are torn across the pathway. The break in circuit $22_1$ is recorded by the electronic module 26. The electronic module 26 will record which circuit is broken, and hence which removable portion has been released or removed, and optionally when it was broken.

The recorded information in the electronic module 26 can be stored in the electronic module until it is removed from the moulded tray and downloaded into a remote device or transmitted to a remote device periodically or when a circuit is broken.

Figure 7:
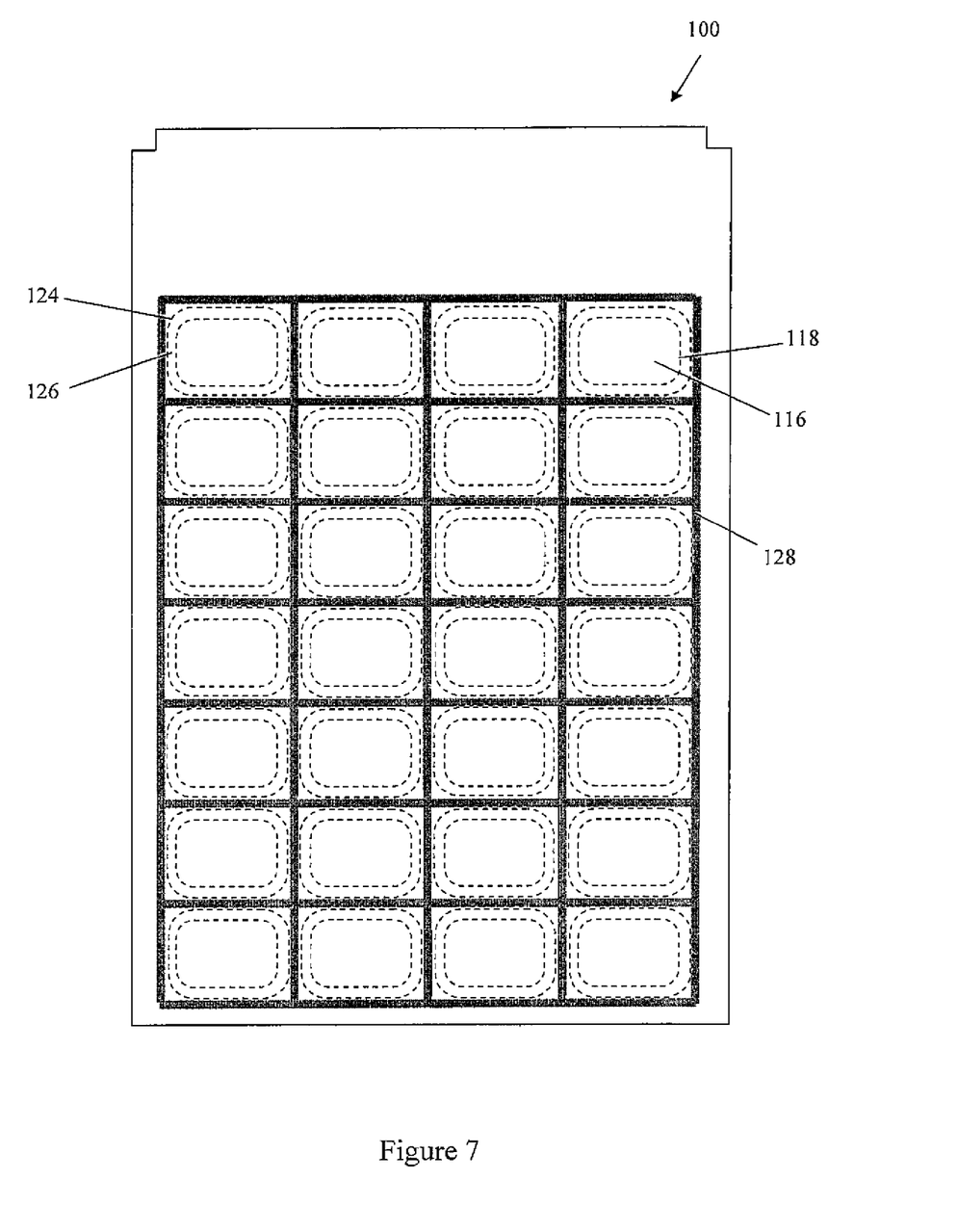
FIG. 7 is top plan view of a seal according to the present invention, showing the cover film and a barrier film, wherein the electrically conductive tracks have been removed so the barrier film and barrier patches can be more clearly seen.
Figure 8:
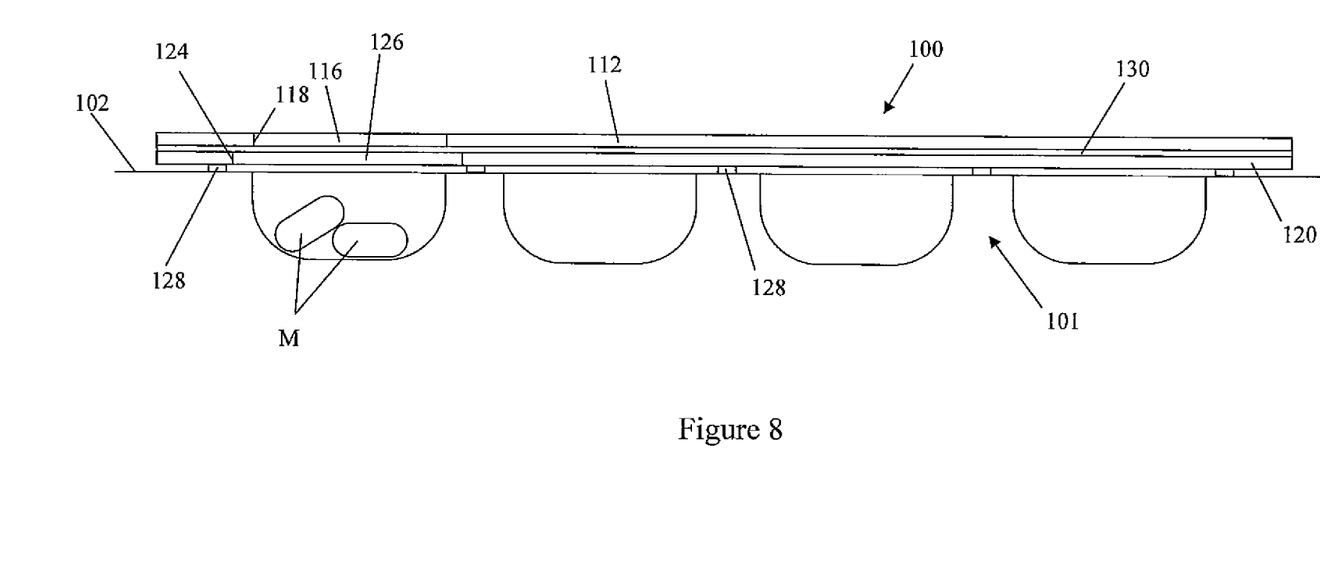
FIG. 8 is a side view of the seal shown in FIG. 7.

FIG. 7 is a top plan view of a seal 100 according to an embodiment of the present invention, showing a cover film 112 and a barrier film 120, and wherein the electrically conductive tracks have been removed so that details of the barrier film can be more clearly seen. FIG. 8 is a side view of the seal shown in FIG. 7. Pre-formed lines of separation 118, in cover film 112, defined removable portions 116 of cover film 112. Barrier film 120 comprises pre-formed lines of separation 124 defining the peripheries of barrier patches 126, one barrier patch for each removable portion 116. Seal 100 is attached to the top surface 120 of a tray 101 by an adhesive 128. Cover film 112 is adhered to barrier film 120 by a layer of peelable adhesive 130. Consumer products in the form of medication M are shown sealed in a cavity of tray 101.

What is claimed is:

1. A seal comprising:
   a flexible cover film having a top side and an underside, and a pattern of electrically conductive tracks that are sufficiently flexible so that they are not broken by flexing or bending the cover film, the cover film having pre-formed lines of separation defining one or more removable portion, each removable portion being attached to the remainder of the cover film by a frangible bridge region defined by a gap in a respective one of the pre-formed lines of separation, each gap having a width, the pattern of electrically conductive tracks defining one or more circuits including a respective circuit for each of the removable portions, each respective circuit including an electrically conductive bridge track along the respective frangible bridge region, each bridge track having a width that is wider than the width of the respective gap, and each frangible bridge region proving a pathway for the respective circuit.

2. The seal according to claim 1, wherein the electrically conductive tracks are printed onto a surface of the cover film using a conductive ink.

3. The seal according to claim 1, wherein each of the one or more circuits terminates at an end region of the cover film.

4. The seal according to claim 1, wherein the periphery of each removable portion is defined by the respective pre-formed line of separation, and the respective pre-formed line of separation comprises a pre-formed cut line extending completely through the cover film, a pre-scored tear line, a pre-perforated tear line, or a combination thereof.

5. The seal according to claim 1, wherein each removable portion is attached to the remainder of the cover film by a non-frangible bridge region defined by a gap in a respective line of separation.

6. The seal according to claim 1, further comprising a layer of peelable adhesive coated on the underside of the cover film and a barrier film secured to the underside of the cover film by the layer of peelable adhesive, the barrier film having pre-formed lines of separation defining one or more barrier patches including a respective barrier patch for each removable portion.

7. The seal according to claim 6, wherein the periphery of each barrier patch is defined by a pre-formed cut line extending completely through the barrier film, a pre-scored tear line, a pre-perforated tear line, or a combination thereof.

8. The seal according to claim 6, wherein each barrier patch is larger than the respective removable portion.

9. The seal according to claim 6, wherein the barrier film is a metal foil, a metalized polymeric film, a metalized paper sheet, a plastics film of single layer construction, a plastics film of multiple layer construction, or a combination thereof.

10. The seal according to claim 1, wherein the seal has one or more of high vapor barrier properties, high light barrier properties, high oxygen barrier properties, and high electrostatic barrier properties.

11. The seal according to claim 1, wherein the pre-formed lines of separation define an array of removable portions.

12. The seal according to claim 1, wherein the cover film is a metal foil, a metalized polymeric film, a metalized paper sheet, a plastics film of single layer construction, a plastics film of multiple layer construction, or a combination thereof.

13. The seal according to claim 1, wherein each removable portion includes a lug portion adapted to be grasped preparatory to removing the respective removable portion.

14. The seal according to claim 13, wherein each removable portion is attached to the remainder of the cover film by a frangible bridge region defined by a gap in a part of the respective pre-formed line of separation that defines the lug portion.

15. A container for storing and dispensing consumer products, comprising:
  a tray having a generally planar top surface into which has been formed one or more discrete cavities for receiving the consumer products;
  consumer products in the one or more discrete cavities; and
  a seal comprising
  a cover film adhered to the generally planar top surface of the tray, the cover film sealing the one or more cavities and retaining the consumer products in the one or more cavities, the cover film having a top side and an underside, and
  a pattern of electrically conductive tracks, the cover film having pre-formed lines of separation defining one or more removable portions, each removable portion being attached to the remainder of the cover film by a frangible bridge region defined by a gap in a respective one of the pre-formed lines of separation, the pattern of electrically conductive tracks defining one or more circuits including a respective circuit for each of the removable portions, the frangible bridge region providing a pathway for the respective circuit, each respective circuit including an electrically conductive bridge track along the respective frangible bridge region, and each bridge track having a width that is wider than the width of the respective gap.

16. The container according to claim 15, further comprising an electronic module for monitoring each of the one or more circuits and recording when each of the one or more removable portion is released or removed from the remainder of the cover film.

17. The container according to claim 16, wherein the electronic module is releasably secured to the tray in electrical contact with each of the one or more circuit.

18. The container according to claim 15, wherein each of the one or more removable portion includes a lug portion adapted to be grasped preparatory to removing the respective removable portion.

19. The container according to claim 18, wherein each of the one or more removable portion is attached to the remainder of the cover film by a frangible bridge region defined by a gap in a part of the respective pre-formed line of separation defines the respective lug portion.

20. The container according to claim 18, wherein the respective circuit for each removable portion extends across the lug portion.

21. The container of claim 15, wherein the cover film is adhered to the generally planar top surface of the tray by an adhesive.

22. The container of claim 15, wherein the cover film is heat-sealed to the generally planar top surface of the tray.

23. The seal according to claim 13, wherein the respective circuit for each removable portion extends across the lug portion.

24. A seal comprising:
  a flexible cover film having a top side and an underside, a layer of peelable adhesive coated on the underside of the cover film, a barrier film adhered to the underside of the cover film by the layer of peelable adhesive, and a pattern of electrically conductive tracks printed on the cover film, the electrically conductive tracks being sufficiently flexible so that they are not broken by flexing or bending the cover film, the cover film having pre-formed lines of separation defining one or more removable portions, each removable portion being attached to the remainder of the cover film by a frangible bridge region defined by a gap in a respective one of the pre-formed lines of separation, the barrier film having preformed lines of separation defining one or more barrier patches including a respective barrier patch for each removable portion the pattern of electrically conductive tracks comprising electrically conductive ink that defines one or more circuits including a respective circuit for each of the removable portion, the frangible bridge providing a pathway for the respective circuit.

* * * * *